(12) United States Patent
Chen et al.

(10) Patent No.: US 12,114,457 B2
(45) Date of Patent: Oct. 8, 2024

(54) MODULAR POWER SUPPLY

(71) Applicant: COOLER MASTER TECHNOLOGY INC., Taipei (TW)

(72) Inventors: Hsin-Hung Chen, Taipei (TW); Jui-Tse Yin, Taipei (TW)

(73) Assignee: COOLER MASTER TECHNOLOGY INC., Taipei (TW)

( * ) Notice: Subject to any disclaimer, the term of this patent is extended or adjusted under 35 U.S.C. 154(b) by 263 days.

(21) Appl. No.: 17/579,522

(22) Filed: Jan. 19, 2022

(65) Prior Publication Data

US 2023/0007802 A1  Jan. 5, 2023

(30) Foreign Application Priority Data

Jun. 30, 2021 (TW) ................................ 110207604

(51) Int. Cl.
*H05K 7/14* (2006.01)
*G06F 1/18* (2006.01)
*G06F 1/20* (2006.01)
*H05K 5/00* (2006.01)

(52) U.S. Cl.
CPC .......... *H05K 7/1432* (2013.01); *G06F 1/189* (2013.01); *G06F 1/20* (2013.01); *H05K 5/0004* (2013.01)

(58) Field of Classification Search
CPC .. H05K 7/1432; H05K 5/0004; H05K 7/1435; H05K 7/20909; G06F 1/189; G06F 1/20; G06F 1/188; G06F 1/18
See application file for complete search history.

(56) References Cited

U.S. PATENT DOCUMENTS

| | | | | |
|---|---|---|---|---|
| 3,925,710 | A | * 12/1975 | Ebert | H05K 7/1424 361/679.02 |
| 4,858,070 | A | * 8/1989 | Buron | H05K 7/1461 361/736 |
| 5,612,854 | A | * 3/1997 | Wiscombe | G06F 1/188 361/679.6 |
| 6,728,099 | B1 | * 4/2004 | Tsang | H05K 7/20727 361/678 |
| 10,551,884 | B1 | * 2/2020 | Chou | G06F 11/2015 |
| 10,992,143 | B2 | * 4/2021 | Chen | H02J 7/0042 |
| 2010/0182749 | A1 | * 7/2010 | Su | H05K 7/2089 361/679.48 |
| 2012/0020795 | A1 | * 1/2012 | Chen | G06F 1/20 416/210 R |

(Continued)

FOREIGN PATENT DOCUMENTS

| CN | 203387211 U | * 1/2014 |
|---|---|---|
| CN | 212572118 U | * 2/2021 |
| FI | 20196123 A1 | * 6/2021 |

OTHER PUBLICATIONS

Lin Jianhua, "A combined-type power supply", Jan. 8, 2014, Shenzhen Benks Technology Co. Ltd, Entire Document (Translation of CN 203387211). (Year: 2014).*

(Continued)

*Primary Examiner* — Stephen S Sul
(74) *Attorney, Agent, or Firm* — Maschoff Brennan

(57) ABSTRACT

A modular power supply is disclosed. The modular power supply includes a power supply unit and an expansion unit. The expansion unit is detachably disposed on the power supply unit and located on one side of the power supply unit in a thickness direction of the modular power supply.

10 Claims, 10 Drawing Sheets

(56) References Cited

U.S. PATENT DOCUMENTS

2012/0275114 A1* 11/2012 Liu .................. G06F 1/26
                                                    415/213.1
2018/0006470 A1*  1/2018 Stacey ............... F21L 4/085
2018/0139871 A1*  5/2018 Stravets ............ H02M 7/003
2022/0361362 A1* 11/2022 Chen ................ G06F 1/20

OTHER PUBLICATIONS

Wang Lei; Wu Yingrong, "Capacity expansion structure of mobile power supply", Feb. 19, 2021, Shenzhen Ecoflow Innovation Tech Co. Ltd., Entire Document (Translation of CN 212572118). (Year: 2021).*

Aguilera Robles Mario Luis, "Modular Power Supply System and Backpack", Jun. 24, 2021, Tespack OY, Entire Document (Translation of FI 20196123). (Year: 2021).*

* cited by examiner

MODULAR POWER SUPPLY

CROSS-REFERENCE TO RELATED APPLICATIONS

This non-provisional application claims priority under 35 U.S.C. § 119(a) on Patent Application No(s). 110207604 filed in Taiwan, R.O.C. on Jun. 30, 2021, the entire contents of which are hereby incorporated by reference.

TECHNICAL FIELD

This disclosure relates to a power supply, more particularly to a modular power supply.

BACKGROUND

With the growth of the esports industry and various requirements, video games with large amount of images or animations require computers with a higher level of performance. As far as conventional gaming computers are concerned, there are usually products of power supplies featuring a single function on the market, and users may purchase power supplies only in the consideration of specification for the computers. However, the specification of gaming computers has becoming higher and more diverse. Therefore, in order to meet the requirement of changing modules to various types, power supplies can be changeable modules for esports gamers to replace according to their demands.

With the increase of specification requirement of PC power supplies, power supplies with diverse performances has become another goal to various brands. However, conventional power supplies have the following drawbacks: 1. They are usually a single set power supplies; 2. The modules can only be installed with the existence of fastening casing and guiding components; and 3. The power supplies do not provide additional functionalities, such as increasing voltage function, liquid cooling function and uninterruptible power function. Therefore, it is required to improve the power supplies for satisfying various applications of the esports gamers.

SUMMARY

Accordingly, this disclosure provides a modular power supply which is capable of providing various additional functions as required by changing a module or unit thereof.

One embodiment of the disclosure provides a modular power supply including a power supply unit and an expansion unit. The expansion unit is detachably disposed on the power supply unit and located on one side of the power supply unit in a thickness direction of the modular power supply.

One embodiment of the disclosure provides a modular power supply including a power supply unit and a support frame. The power supply unit has a first connection surface. The first connection surface is located at one side of the power supply unit in a length direction of the modular power supply. The support frame is stacked on the first connection surface, and the power supply unit and the support frame together form an installation space for an object to be disposed therein.

According to the modular power supply as described above, the expansion unit is vertically stacked on the power supply unit in the thickness direction of the modular power supply. This configuration simplifies the installation of the expansion unit on the power supply unit, reduces manufacturing costs of the modular power supply, and allows various types of expansion units to be installed.

DETAILED DESCRIPTION

Figure 1:
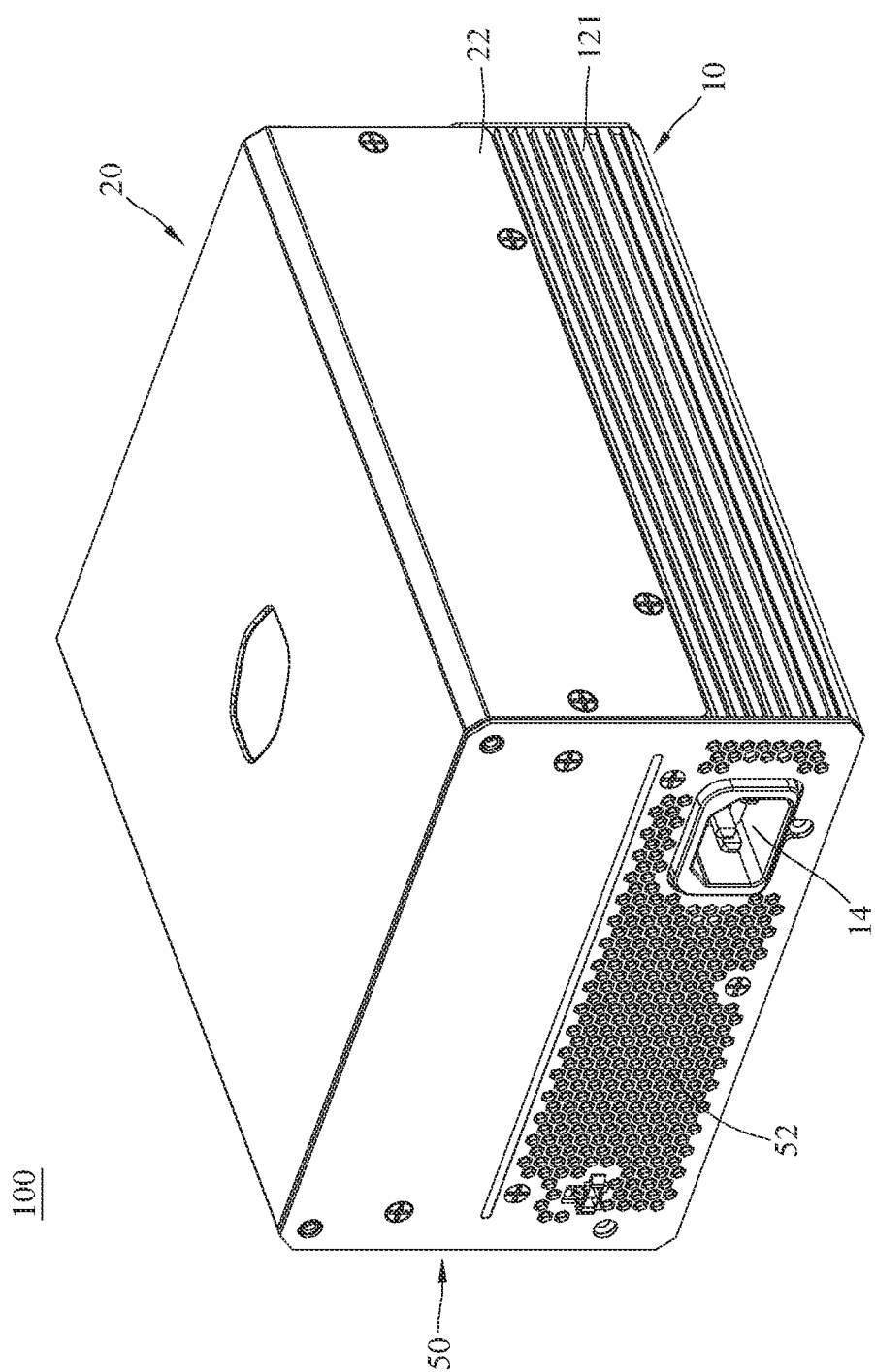
FIG. 1 is a perspective view of a modular power supply in accordance with the first embodiment of the disclosure.
Figure 2:
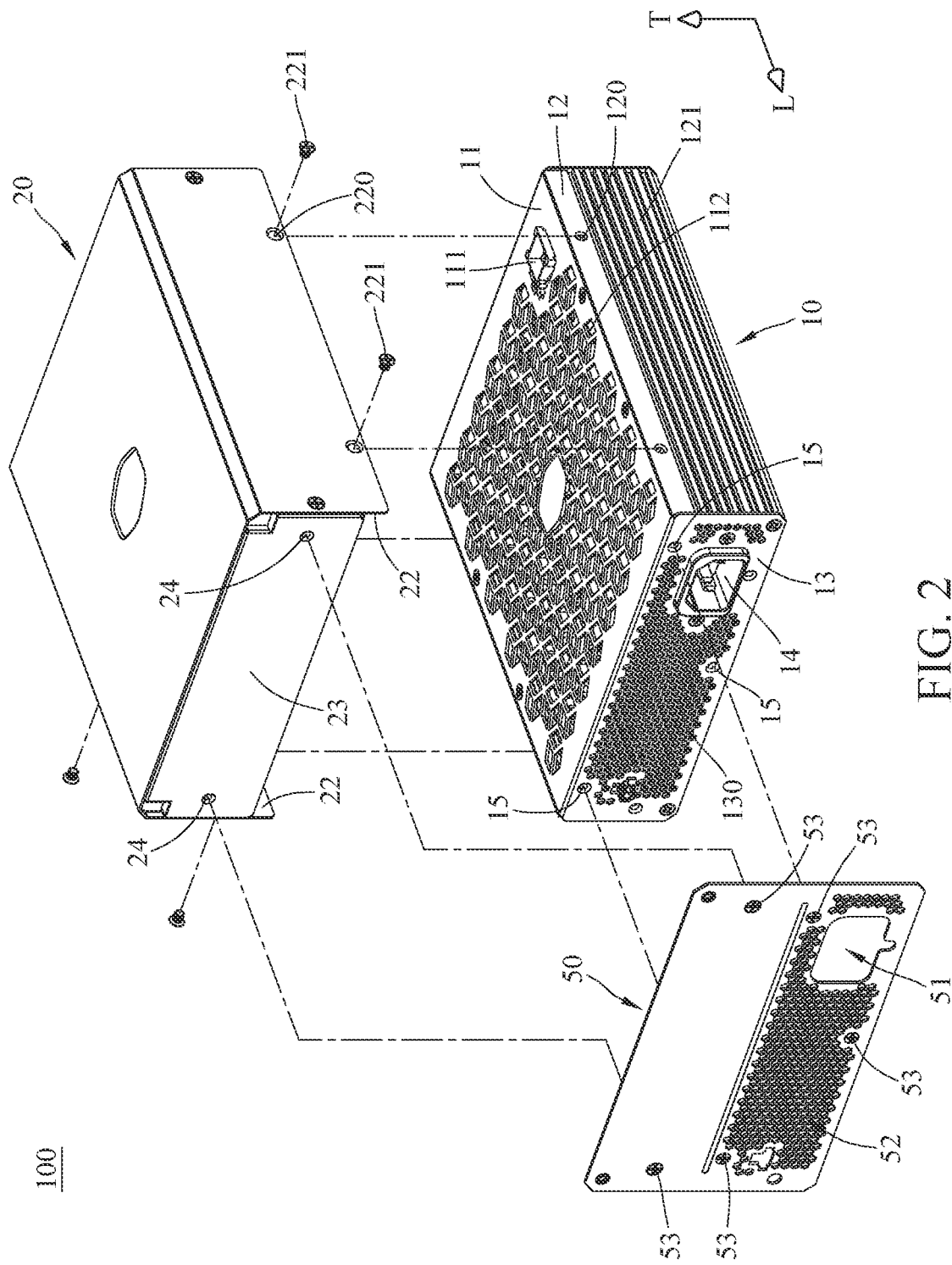
FIG. 2 is an exploded view of the modular power supply in FIG. 1.
Figure 3:
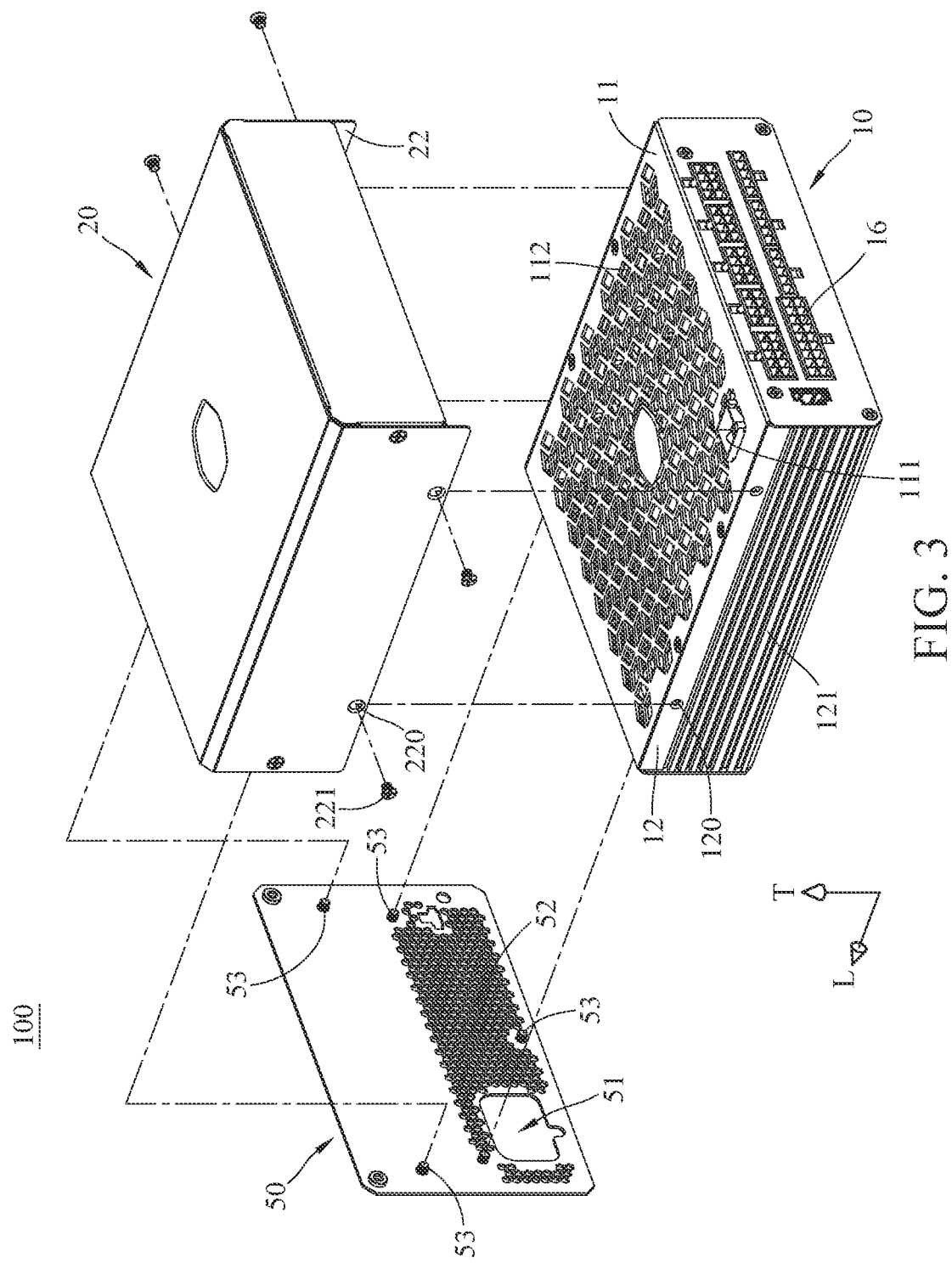
FIG. 3 is another exploded view of the modular power supply in FIG. 1.

Please refer to FIG. 1 to FIG. 3. FIG. 1 is a perspective view of the modular power supply 100 in accordance with the first embodiment of the disclosure, FIG. 2 is an exploded view of the modular power supply 100 in FIG. 1, and FIG. 3 is another exploded view of the modular power supply 100 in FIG. 1.

In this embodiment, the modular power supply 100 includes a power supply unit 10 and an expansion unit 20. Furthermore, the modular power supply 100 can also include a support frame 50. The power supply unit 10 is, for example, not provided with a fan so as to reduce noise of the power supply unit 10. The expansion unit 20 is, for example, provided with a fan, a liquid cooling device, a battery, or a power supply assembly, and users may choose one of them to install according to actual requirement. Detailed descriptions are given below. The expansion unit 20 is detachably disposed on the power supply unit 10 via the support frame 50 and located on one side of the power supply unit 10 in a thickness direction T of the modular power supply 100. The assembled modular power supply 100 can be, for example, disposed on a computer casing.

Figure 4:
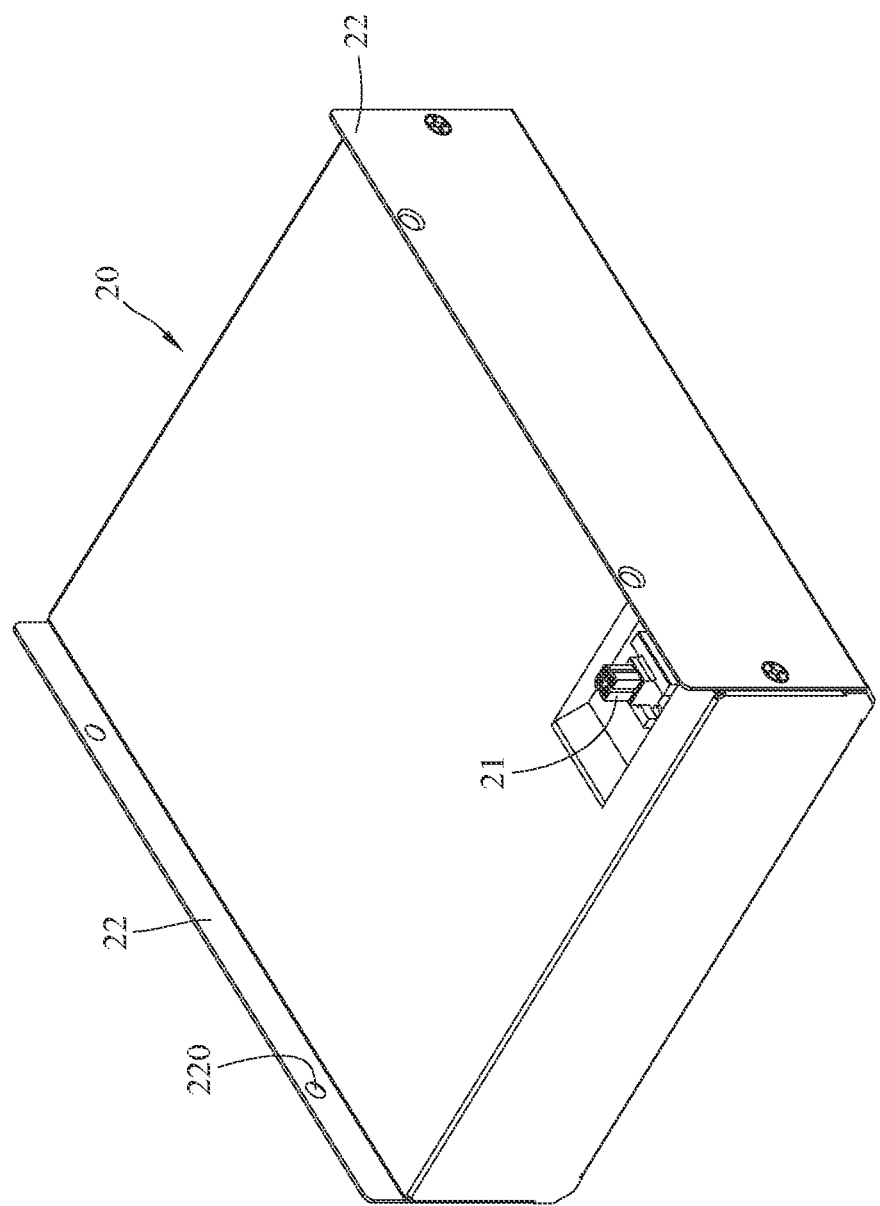
FIG. 4 is a perspective view of an expansion unit in FIG. 1.
Figure 5:
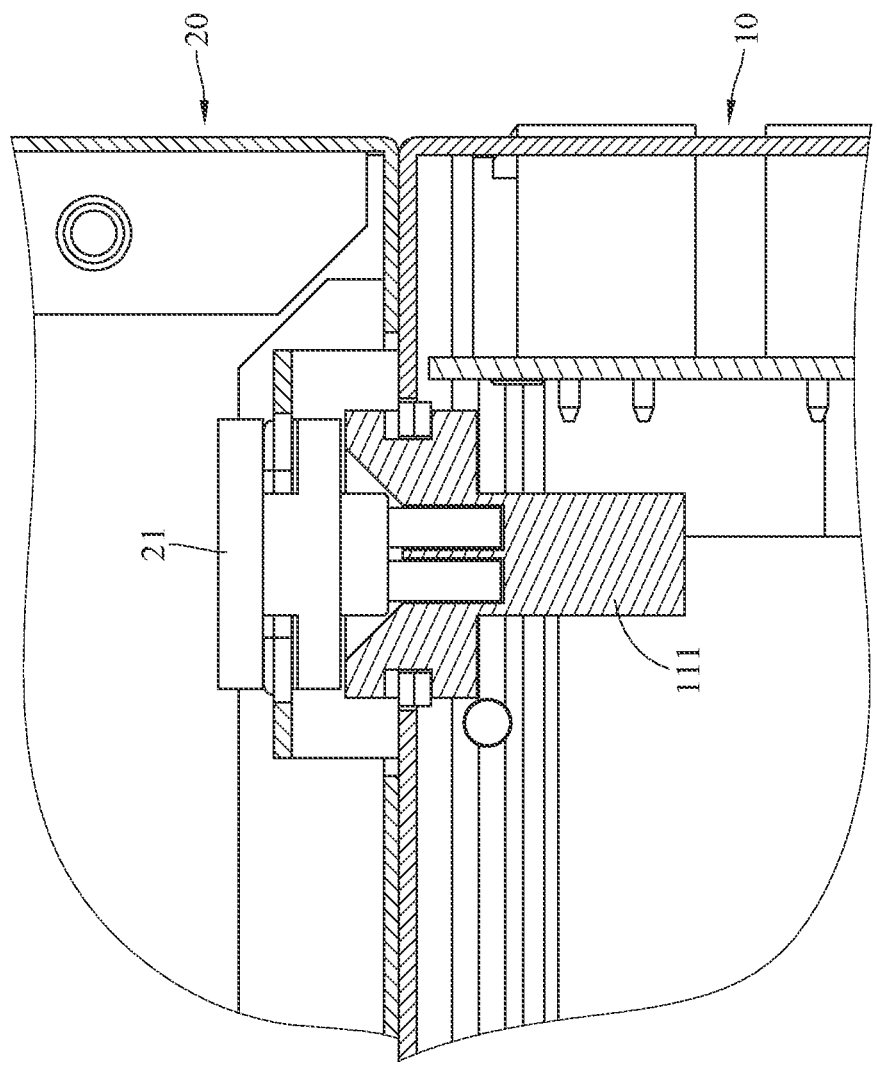
FIG. 5 is a partial cross-sectional view of the modular power supply in FIG. 1.

Please also refer to FIG. 4 and FIG. 5. FIG. 4 is a perspective view of the expansion unit 20 in FIG. 1, and FIG. 5 is a partial cross-sectional view of the modular power supply 100 in FIG. 1. In this embodiment, the power supply unit 10 has a top surface 11 and a first electrical connection port 111. The top surface 11 is located at one side of the power supply unit 10 in the thickness direction T of the modular power supply 100. An insertion hole of the first electrical connection port 111 is located at the top surface 11. The expansion unit 20 has a second electrical connection port 21. The expansion unit 20 is stacked on the top surface 11 of the power supply unit 10, and the second electrical connection port 21 is detachably inserted into the first electrical connection port 111. As such, the power supply unit 10 and the expansion unit 20 are assembled in a vertically stacked configuration, and they are electrically connected to each other.

In this embodiment, the power supply unit 10 has a first connection surface 13 located at one side of the power supply unit 10 in a length direction L of the modular power supply 100. The expansion unit 20 has a second connection surface 23 located at one side of the expansion unit 20 in the length direction L of the modular power supply 100. The support frame 50 is stacked on the first connection surface 13 and the second connection surface 23 for increasing the overall structure strength of the expansion unit 20 and the power supply unit 10.

In this embodiment, the support frame 50 has a plurality of fasteners 53, and the fasteners 53 are, for example, screws. The power supply unit 10 has a plurality of first fastening holes 15. The first fastening holes 15 are located at the first connection surface 13. The expansion unit 20 has a plurality of second fastening holes 24. The second fastening holes 24 are located at the second connection surface 23. The fasteners 53 are respectively screwed into the first fastening holes 15 and the second fastening holes 24. The collaboration of the fasteners 53, the first fastening holes 15, and the second fastening holes 24 fixes the expansion unit 20 and the power supply unit 10 on the support frame 50, such that the expansion unit 20 is firmly stacked on the power supply unit 10 so as to further increase the overall structure strength of the expansion unit 20 and the power supply unit 10.

Note that the means of fixing the expansion unit 20 and the power supply unit 10 on the support frame 50 may be modified as required; in some other embodiments, the power supply unit and the expansion unit may be fixed on the support frame via any desired means, such as in a snap-fit manner or a riveting manner.

In this embodiment, the power supply unit 10 further has an input connector 14 and an output connector 16. The support frame 50 further has an opening 51. The input connector 14 is exposed by the opening 51. The output connector 16 and the input connector 14 are respective located at two opposite sides (e.g., two opposite surfaces) of the power supply unit 10 in the length direction L of the modular power supply 100. The input connector 14 is configured to connect to the domestic power for power input. The output connector 16 is configured to connect to electronic components, such as fans, hard drives and motherboards of a computers or a server.

In this embodiment, the power supply unit 10 further has an air inlet 112 and an air outlet 130. The air inlet 112 is located at the top surface 11. The air outlet 130 is located at the first connection surface 13. The support frame 50 has a vent hole 52 connected to the air outlet 130. In this configuration, air in the environment is able to flow into the power supply unit 10 through the air inlet 112 and flow out of the power supply unit 10 through the air outlet 130 in a natural convection manner so as to take heat in the power supply unit 10 to the environment, thereby cooling the power supply unit 10.

In this embodiment, the power supply unit 10 further has a first connection part 12. The first connection part 12 has a plurality of engagement holes 120. The expansion unit 20 further has a second connection part 22. The second connection part 22 and the first connection part 12 are respective a protrusion and a recess matching each other. The second connection part 22 has a plurality of through holes 220. A plurality of engagement components 221 are respectively disposed through the through holes 220 and fastened into the engagement holes 120, so that the second connection part 22 is fixed to the first connection part 12. Therefore, it prevents the power supply unit 10 and the expansion unit 20 from being moved relative to each other in a direction different from the length direction L and the thickness direction T and increases the overall structure strength of the power supply unit 10 and the expansion unit 20.

In this embodiment, the power supply unit 10 further has a heat sink 121 located next to the first connection part 12 for helping the power supply unit 10 to dissipate heat therein no matter the power supply unit 10 has fans or not.

Figure 6:
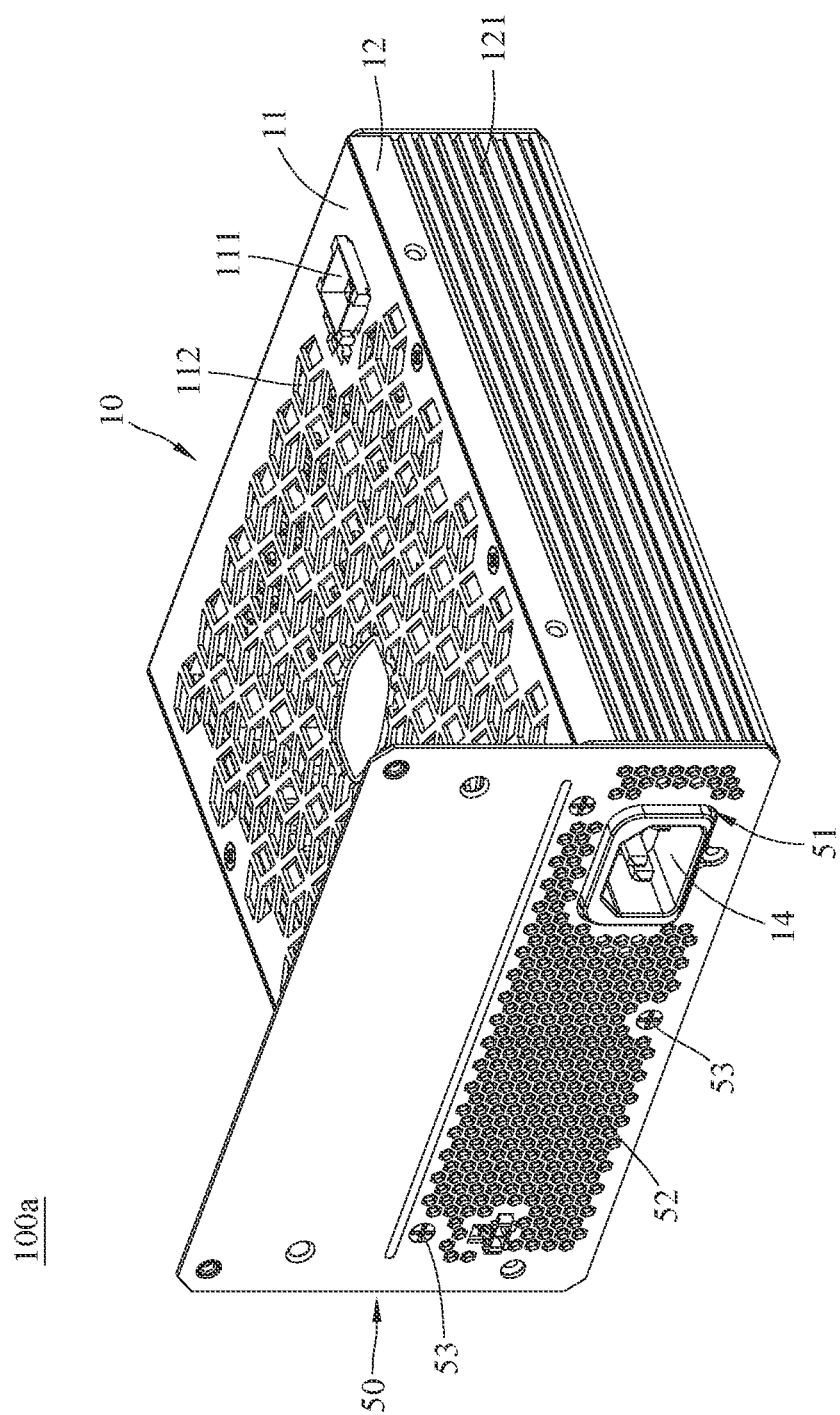
FIG. 6 is a perspective view of a modular power supply in accordance with the second embodiment of the disclosure.

Note that the configuration of the modular power supply 100 may be modified as required; in some other embodiments, a modular power supply may only include a power supply unit and an expansion unit without a support frame, or only include a power supply unit and a support frame without an expansion unit. The following paragraph will introduce a case that a modular power supply only includes a power supply unit and support frame without an expansion unit. Please refer to FIG. 6, which is a perspective view of a modular power supply 100a in accordance with the second embodiment of the disclosure.

In this embodiment, the modular power supply 100a includes a power supply unit 10 and a support frame 50. The power supply unit 10 has a first connection surface 13 located at one side of the power supply unit 10 in a length direction L of the modular power supply 100a. The support frame 50 is stacked on first connection surface 13, and the power supply unit 10 and the support frame 50 together form an installation space for an expansion unit or other object to be disposed therein. The detailed structures of the power supply unit 10 and the support frame 50 are similar to that of the above embodiment, and components with the same reference numerals in this and above embodiment have the same or similar functions, such that repeated descriptions of the power supply unit 10 and the support frame 50 are omitted hereinafter.

Figure 7:
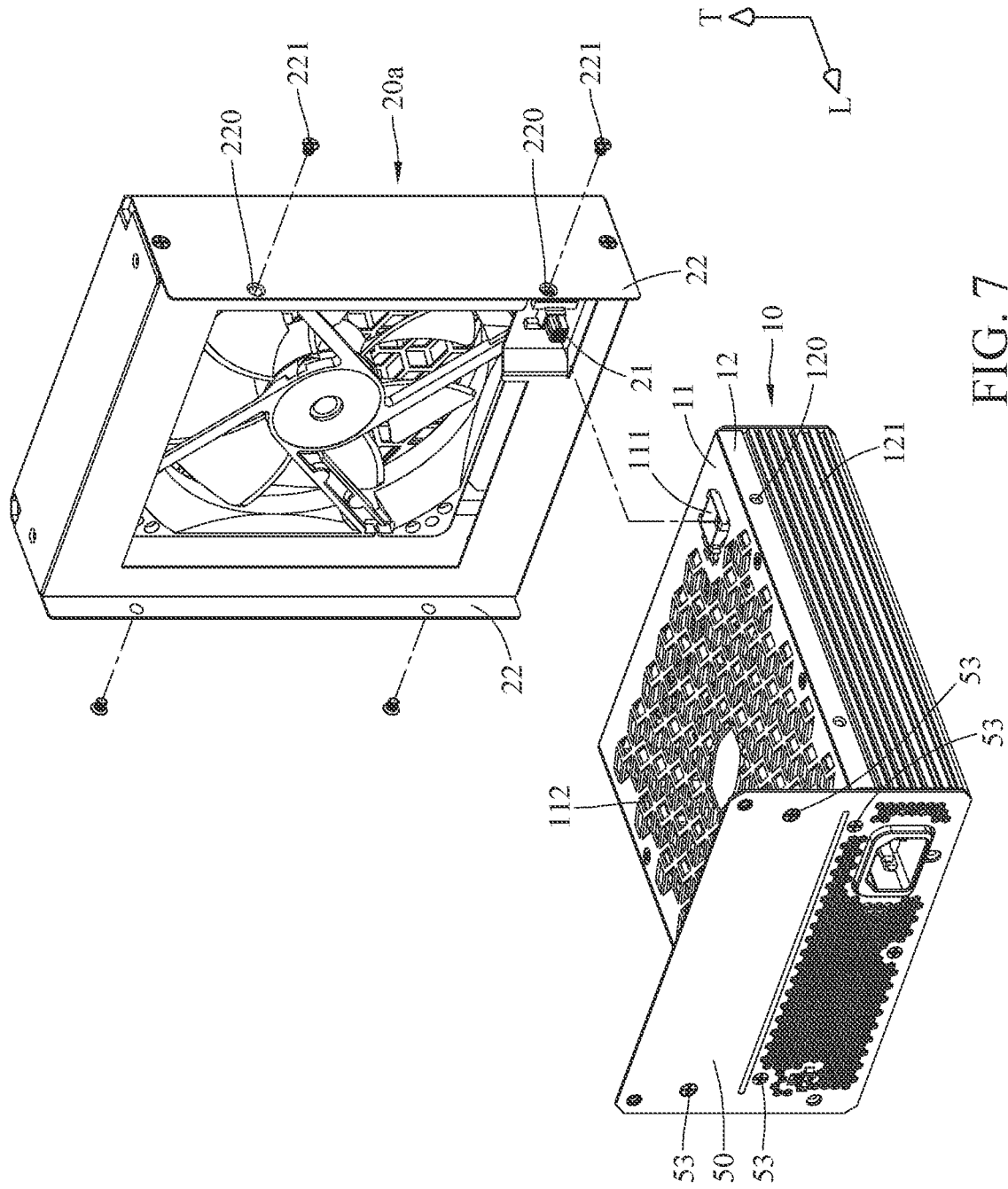
FIG. 7 is a perspective view of a modular power supply in accordance with the third embodiment of the disclosure.
Figure 8:
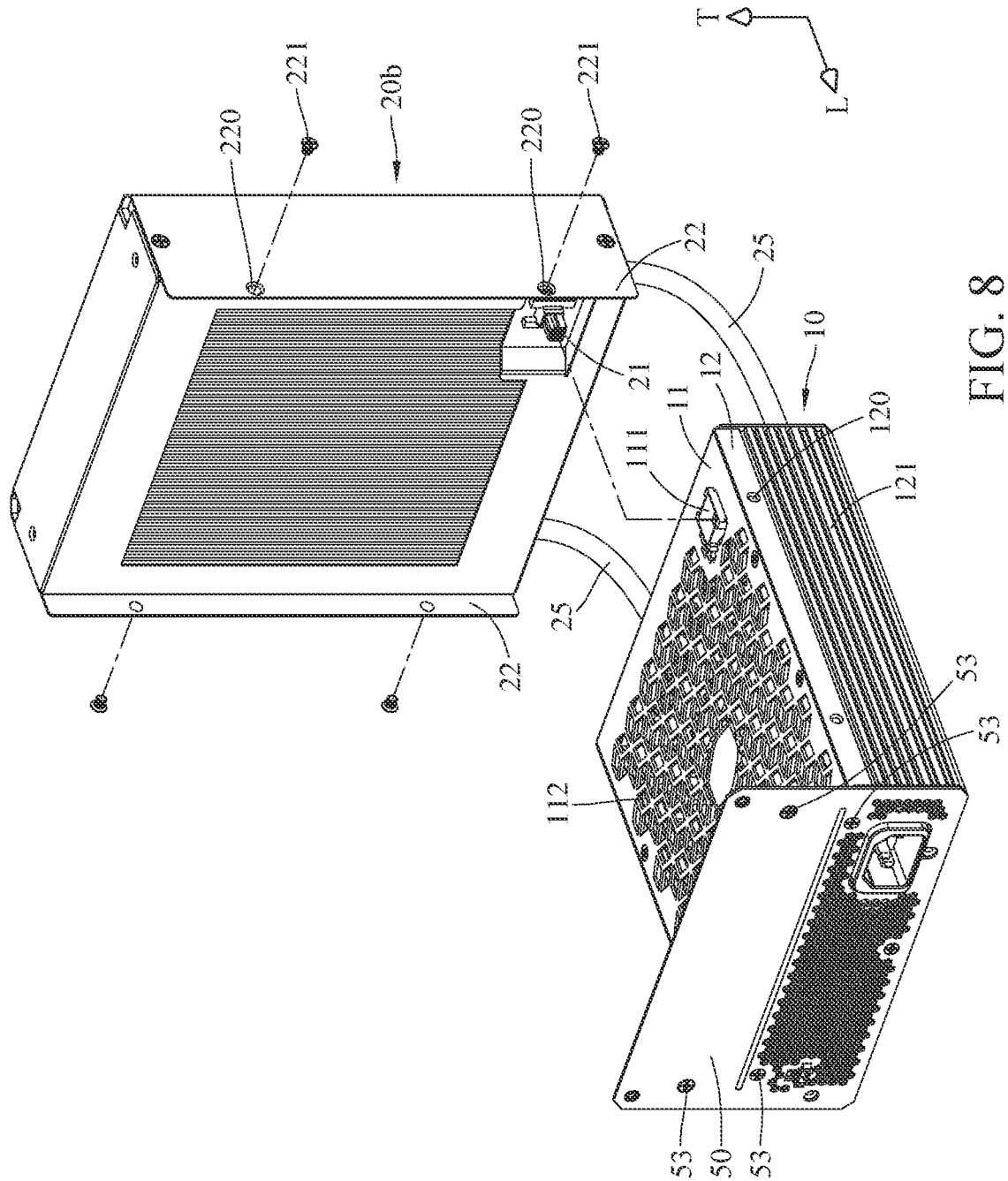
FIG. 8 is a perspective view of a modular power supply in accordance with the fourth embodiment of the disclosure.
Figure 9:
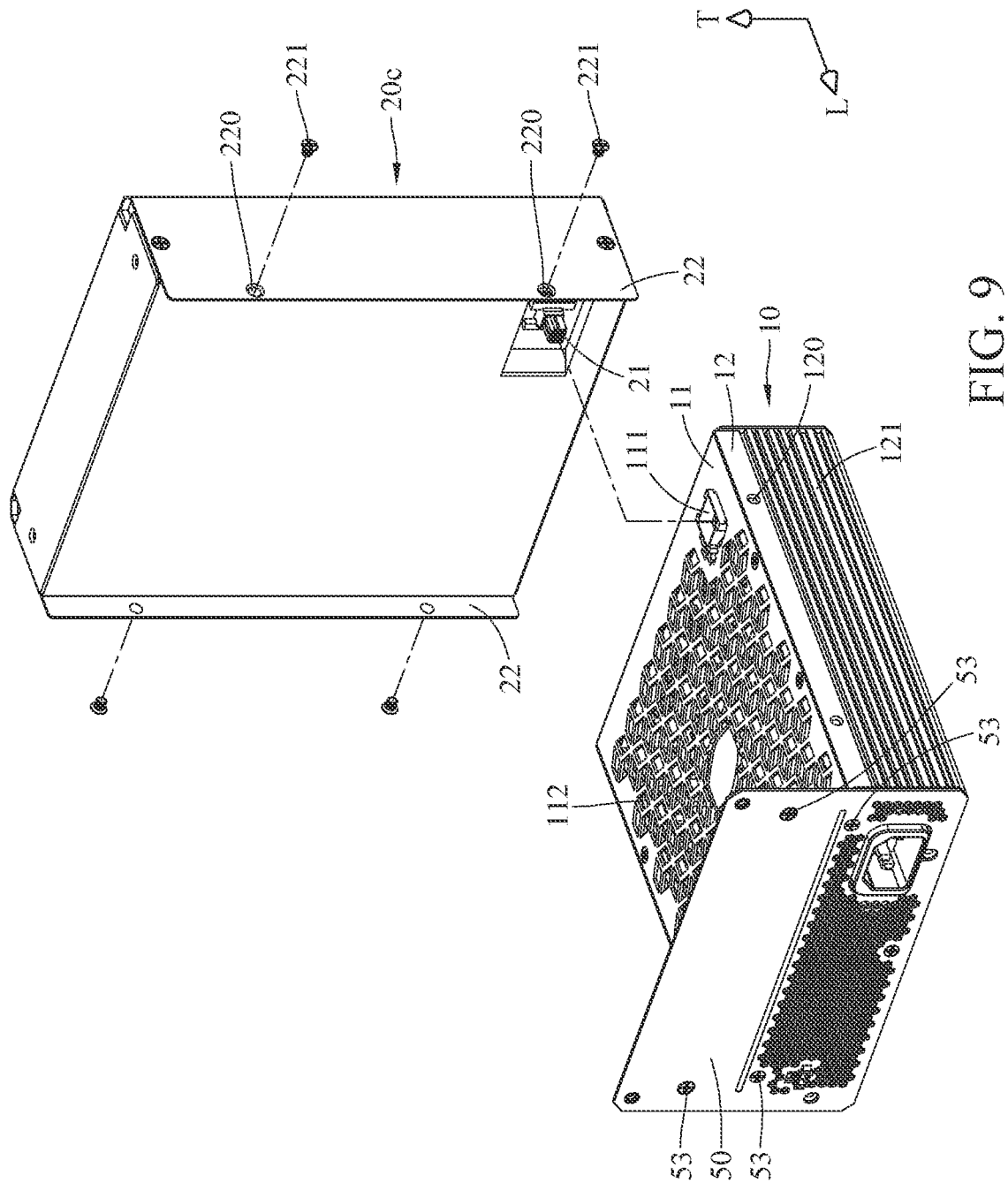
FIG. 9 is a perspective view of a modular power supply in accordance with the fifth embodiment of the disclosure.
Figure 10:
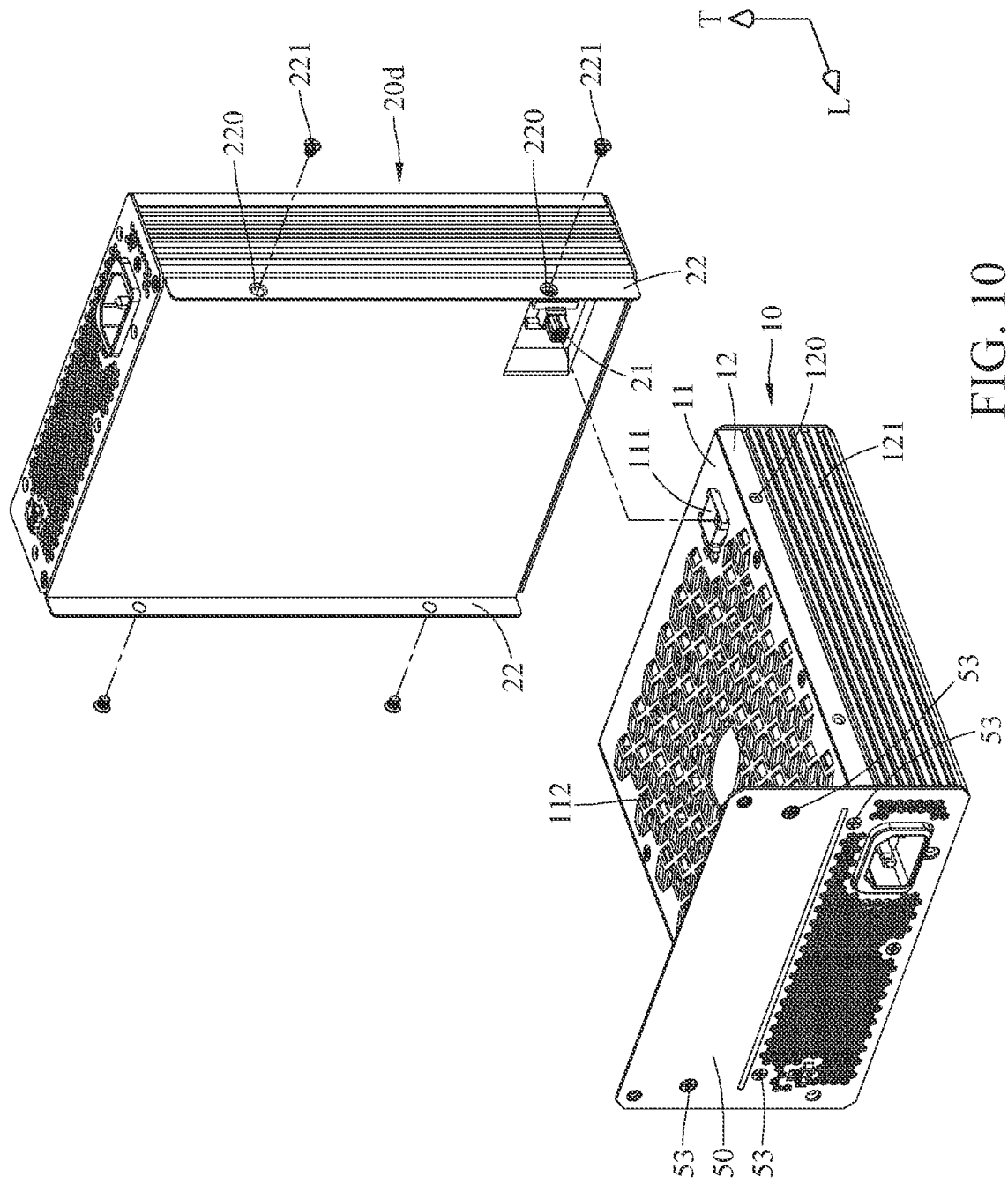
FIG. 10 is a perspective view of a modular power supply in accordance with the sixth embodiment of the disclosure.

Please refer to FIG. 7 to FIG. 10. FIG. 7 is a perspective view of a modular power supply in accordance with the third embodiment of the disclosure, FIG. 8 is a perspective view of a modular power supply in accordance with the fourth embodiment of the disclosure, FIG. 9 is a perspective view of a modular power supply in accordance with the fifth embodiment of the disclosure, and FIG. 10 is a perspective view of a modular power supply in accordance with the sixth embodiment of the disclosure.

As shown in FIG. 7, in a case where the power supply unit 10 is applied to devices of high power consumption, and the heat dissipation capability of such power supply unit 10 is not able to meet the heat dissipation requirement of the devices, users may install a fan unit 20a on the power supply unit 10 so as to enhance the heat dissipation performance of the modular power supply 100. The detailed structures of the power supply unit 10 are similar to that of the above embodiments, the detailed structures of the fan unit 20a are similar to that of the expansion unit 20, and components with the same reference numerals in this and above embodiments have the same or similar functions, such that repeated descriptions of the power supply unit 10 and the fan unit 20a are omitted hereinafter.

As shown in FIG. 8, in a case where the power supply unit 10 is applied to devices of high power consumption, and the heat dissipation capability of such power supply unit 10 is not able to meet the heat dissipation requirement of the devices, the power supply unit 10 may be connected to a liquid cooling unit 20b via tubes 25 so as to enhance the heat dissipation capability of the modular power supply 100.

As shown in FIG. 9, users may further install a battery unit 20c on the power supply unit 10, so that the battery unit 20c can provide the modular power supply 100 with backup power in a power failure condition.

As shown in FIG. 10, in a case where the power supply unit 10 is applied to devices having a large number of power consumption components or applied to devices of high power consumption, users may further install another power supply unit 20d on the power supply unit 10 so as to increase the upper limit of power supply and upper limit of power consumption of the modular power supply 100. Therefore, a higher power consumption requirement of electronic devices can be met.

According to the modular power supply as described above, the expansion unit is vertically stacked on the power supply unit in the thickness direction of the modular power supply. This configuration simplifies the installation of the expansion unit on the power supply unit, reduces manufacturing costs of the modular power supply, and allows the expansion unit of different type to be installed. In addition, the support frame or the collaboration of the connection parts of the power supply unit and the expansion unit facilitates the overall structure strength of the power supply unit and the expansion unit. Moreover, the overall structure strength of the power supply unit and the expansion unit can be further increased via the screws fixing the power supply unit to the expansion.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A modular power supply, comprising:
   a power supply unit; and
   an expansion unit, detachably disposed on the power supply unit and located on one side of the power supply unit in a thickness direction of the modular power supply;
   wherein the power supply unit has a top surface and a first electrical connection port, the top surface is located at the one side of the power supply unit in the thickness direction of the modular power supply, an insertion hole of the first electrical connection port is located at the top surface, the expansion unit has a second electrical connection port, the expansion unit is stacked on the top surface of the power supply unit, and the second electrical connection port is detachably inserted into the first electrical connection port; and
   wherein the modular power supply further comprises a support frame, the power supply unit has a first connection surface, the first connection surface is located at one side of the power supply unit in a length direction of the modular power supply, the expansion unit has a second connection surface, the second connection surface is located at one side of the expansion unit in the length direction of the modular power supply, and the support frame is stacked on the first connection surface and the second connection surface.

2. The modular power supply of claim 1, wherein the support frame has a plurality of fasteners, the power supply unit has a plurality of first fastening holes, the plurality of first fastening holes are located at the first connection surface, the expansion unit has a plurality of second fastening holes, the plurality of second fastening holes are located at the second connection surface, and the plurality of fasteners are respectively fastened into the plurality of first fastening holes and the plurality of second fastening holes.

3. The modular power supply of claim 1, wherein the power supply unit further has an input connector, the support frame further has an opening, and the input connector is exposed by the opening.

4. The modular power supply of claim 3, wherein the power supply unit further has an output connector, and the output connector and the input connector are respectively located at two opposite sides of the power supply unit in the length direction of the modular power supply.

5. The modular power supply of claim 1, wherein the power supply unit further has an air inlet and an air outlet, the air inlet is located at the top surface, the air outlet is located at the first connection surface, and the support frame has a vent hole connected to the air outlet.

6. The modular power supply of claim 1, wherein the power supply unit further has a first connection part, the first connection part has a plurality of engagement holes, the expansion unit further has a second connection part, the second connection part and the first connection part are respectively a protrusion and a recess matching each other, the second connection part has a plurality of through holes, a plurality of engagement components are respectively disposed through the plurality of through holes and fastened into the plurality of engagement holes, so that the second connection part is fixed to the first connection part.

7. The modular power supply of claim 6, wherein the power supply unit further has a heat sink located next to the first connection part.

8. The modular power supply of claim 1, wherein the expansion unit is a fan unit, a liquid cooling unit, a battery unit or another power supply unit.

9. A modular power supply, comprising:
   a power supply unit; and
   an expansion unit, detachably disposed on the power supply unit and located on one side of the power supply unit in a thickness direction of the modular power supply;
   wherein the power supply unit has a first connection part, the first connection part has a plurality of engagement holes, the expansion unit has a second connection part, the second connection part and the first connection part are respectively a protrusion and a recess matching each other, the second connection part has a plurality of through holes, a plurality of engagement components are respectively disposed through the plurality of through holes and fastened into the plurality of engagement holes, so that the second connection part is fixed to the first connection part.

10. The modular power supply of claim 9, wherein the power supply unit further has a heat sink located next to the first connection part.

* * * * *